(12) United States Patent
Kinzer et al.

(10) Patent No.: US 6,512,267 B2
(45) Date of Patent: Jan. 28, 2003

(54) SUPERJUNCTION DEVICE WITH SELF COMPENSATED TRENCH WALLS

(75) Inventors: Daniel M. Kinzer, El Segundo, CA (US); Srikant Sridevan, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 16 days.

(21) Appl. No.: 09/834,115

(22) Filed: Apr. 12, 2001

(65) Prior Publication Data

US 2002/0149051 A1 Oct. 17, 2002

(51) Int. Cl.[7] .............................................. H01L 29/78
(52) U.S. Cl. ........................ 257/335; 257/339; 257/342
(58) Field of Search .................................. 257/335, 339, 257/341, 342

(56) References Cited

U.S. PATENT DOCUMENTS

| | | | | |
|---|---|---|---|---|
| 5,216,275 A | * | 6/1993 | Chen | 257/493 |
| 5,438,215 A | * | 8/1995 | Tihanyi | 257/341 |
| 6,040,600 A | | 3/2000 | Uenishi et al. | 257/330 |
| 6,081,009 A | * | 6/2000 | Neilson | 257/341 |
| 6,291,856 B1 | * | 9/2001 | Miyasaka et al. | 257/335 |
| 6,337,499 B1 | * | 1/2002 | Werner | 287/339 |
| 6,376,878 B1 | * | 4/2002 | Kocon | 257/335 |
| 6,400,003 B1 | * | 6/2002 | Huang | 257/339 |

* cited by examiner

Primary Examiner—Gene M. Munson
(74) Attorney, Agent, or Firm—Ostrolenk, Faber, Gerb & Soffen, LLP

(57) ABSTRACT

A superjunction device has a large number of symmetrically located vertical circular wells in a high resistivity silicon substrate. A plurality of alternate opposite conductivity N and P stripes or nodes are formed along the length of the walls of each of the wells. Each of the nodes faces an opposite concentration type node in an adjacent well. A DMOS gate structure is connected to the tops of the N stripes. The nodes have a depth and concentration to cause full depletion of all nodes during reverse bias. Current flows through the relatively low resistance N stripes when its gate is turned on. A conventional termination such as a diffused ring or rings can surround the active area of all cells and is formed in the high resistivity substrate.

30 Claims, 6 Drawing Sheets

SUPERJUNCTION DEVICE WITH SELF COMPENSATED TRENCH WALLS

FIELD OF THE INVENTION

This invention relates to MOS gated semiconductor devices and more specifically relates to a novel superjunction type semiconductor device structure in which each of a plurality of trenches have a plurality of longitudinally extending opposite conductivity regions which act to deplete one another during voltage blocking operation.

BACKGROUND OF THE INVENTION

Superjunction devices are well known, such as devices shown in copending application Ser. No. 09/732,401, filed Dec. 7, 2000 entitled HIGH VOLTAGE VERTICAL CONDUCTION SUPERJUNCTION SEMICONDUCTOR DEVICE in the name of Daniel M. Kinzer and Srikant Sridevan (IR-1756). In these devices, a plurality of spaced parallel vertical conduction regions or pedestals of one conductivity type extend vertically through a wafer of semiconductor material of the other conductivity type. A conventional DMOS type of structure may be used to turn the device on and off between a top source electrode and a bottom drain electrode. The concentrations and lateral dimensions and spacings of the vertical conduction regions is designed so that when blocking voltage is applied between the drain and source electrodes, the vertical N and P regions each fully deplete to prevent conduction. However, when conduction is desired, it can take place through the undepleted drift regions which are connected to the source electrode by a suitable MOS gate structure. These regions can have a higher concentration than that needed in the conventional vertical conduction MOSFET because its concentration is no longer related to a low concentration needed for a given blocking voltage. Consequently, superjunction devices will generally have a lower $R_{DSON}$ than the conventional MOSFET which requires a higher resistivity body or substrate to block voltage.

Superjunction devices also usually require a complex termination structure surrounding the active area because the wafer body has a relatively high concentration. Thus, it is more difficult to deplete the high concentration termination region as with conventional diffusion rings which are used in low resistivity epitaxial layers of prior art power MOSFETs.

It has been found that the performance characteristics of the superjunction device described above are very sensitive to processing conditions. Thus, the cell dimensions must be precisely controlled; the concentration of the N and P depletion regions must be very carefully controlled, and the design and processing of the termination region is very complex. It would be desirable to produce a superjunction device which is less dependent on precise processing conditions and which can also employ a simple termination.

BRIEF DESCRIPTION OF THE INVENTION

In accordance with the invention a novel structure is provided in which the sidewalls of vertical trenches are doped by alternating N and P stripes which extend from top to bottom of the trenches, and which are self-compensating. Thus, the alternate N and P stripes act to deplete one another during blocking while only one set of the stripes, for example, the N stripes are connected to a source electrode and conduct when the device is turned on.

More specifically, parallel spaced and symmetrically disposed vertical cylindrical wells are etched in a highly resistive, for example, 40 ohm cm silicon substrate. The side walls of each of the cells are then implanted 4 times at different twist angles to produce adjacent vertical stripes of alternating N and P concentrations, using appropriate implant dopants for the alternate stripes. This creates, for each well, a self-compensated cell appropriate for use in charge compensation (e.g. superjunction) devices. The wells can be placed closely together, employing a cellular design, with contacts in polysilicon windows located between the wells. A conventional DMOS structure which permits the connection of a source region to the top of one set of wells can be used to turn the device on and off. A conventional guard ring type termination can also be employed in the high resistivity substrate, greatly simplifying the design of the device and its process of manufacture.

DETAILED DESCRIPTION OF THE DRAWINGS

Figure 1:
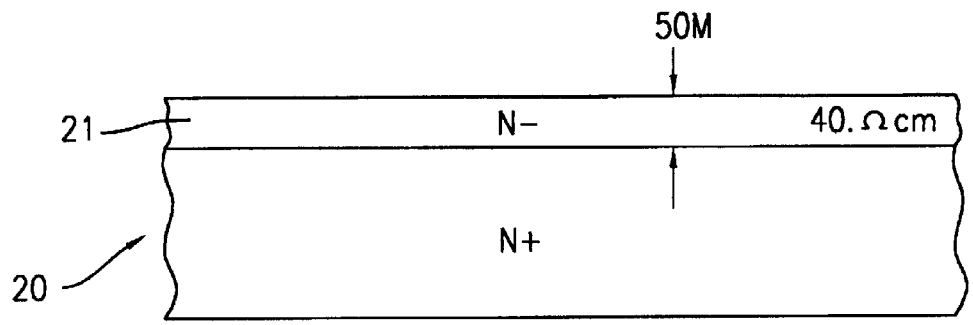
FIG. 1 is a cross-section of the starting wafer used to make devices in accordance with the invention.

Referring first to FIG. 1, there is shown the starting wafer 20. Wafer 20 is a conventional high concentration N type wafer (for an N channel device to be described) and has a trench and junction-receiving epitaxially grown layer 21 which may have a high resistivity, for example, 40 ohm cm and may be about 50 microns thick. By contrast, the epitaxial layers conventionally used for superjunction devices need a much higher concentration to obtain the desired low $R_{DSON}$. This complicates the termination structure. A simple guard ring termination structure can be used with the high resistivity substrate 21 of the invention. The epitaxial resistivity which may be used with the invention varies from about 40 ohm cm to about 80 ohm cm.

Figure 2:
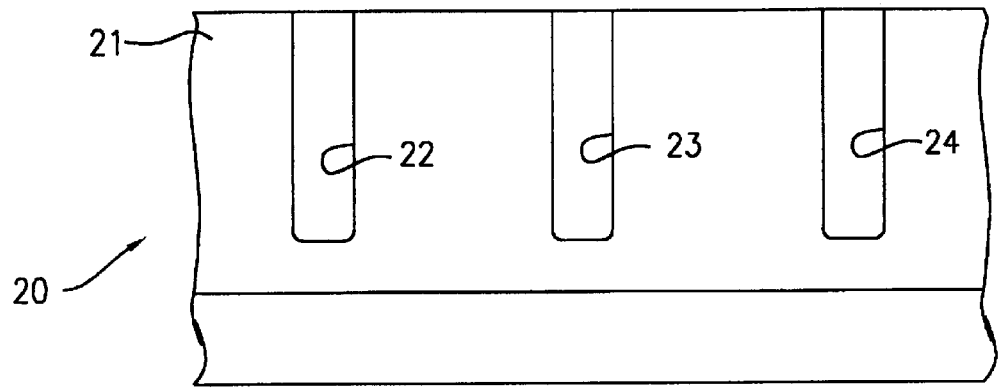
FIG. 2 shows a small section of FIG. 1 after symmetrically spaced cylindrical wells have been etched therein.
Figure 3:
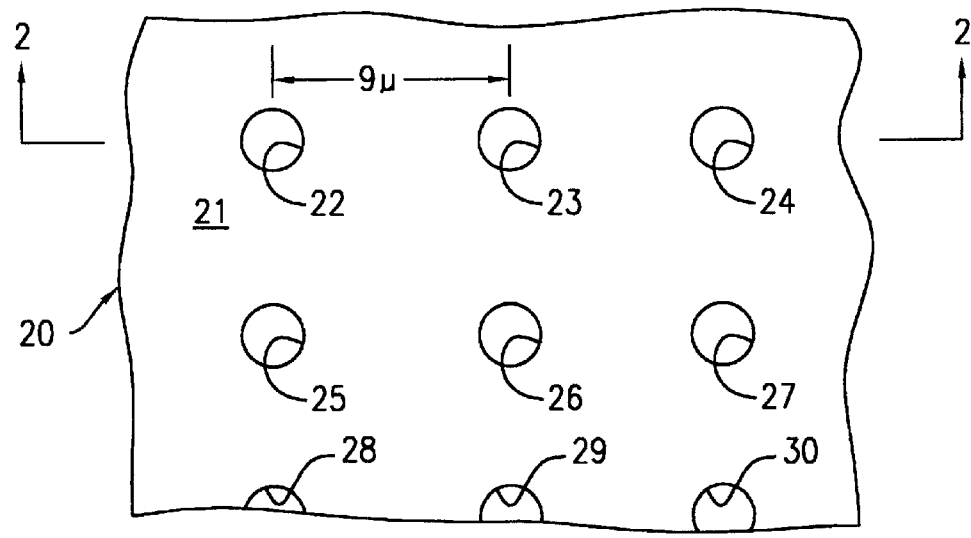
FIG. 3 is a top view of FIG. 2.
Figure 5:
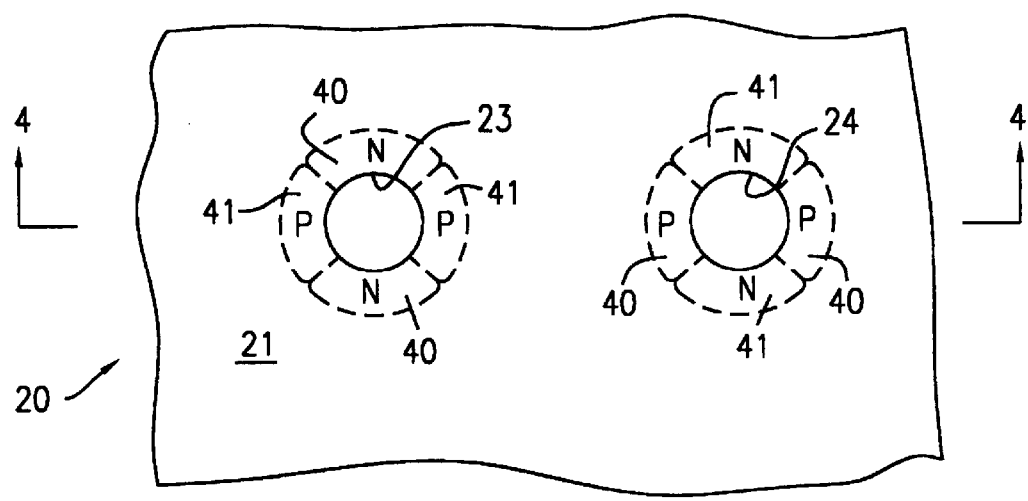
FIG. 5 is a top view of FIG. 4.

As next shown in FIGS. 2 and 3, a plurality of cylindrical wells, for example, wells 22 to 30 are etched into the upper surface of layer 21.

The etch process may be any well known highly anisotropic, high speed plasma etch through openings in a dielectric mask. One etch, employing $SiF_4$ produces acceptable speed and aspect ratio for the trench.

Any cross-section can be used for the trench, such as square, hexagonal, and the like. The use of four stripes within each cell is optimal, although two could also work. A greater number of stripes would probably cause overlapping implants.

The dose used in the preferred embodiment is in the range of $1E10^{13}$ to $5 \times 10^{14}$ atoms per cm$^2$ at a low energy, followed by an anneal at up to 1125° C., as required during a subsequent channel drive. By way of example, boron can be used at 8E13, 30 KeV and phosphorous at 8E13, 100KeV The diameter of the trenches is greater than about 1.5 $\mu$. The smallest possible diameter, consistent with the ability to implant the cell wall, is used to obtain maximum cell density. Thus, a 3.4 $\mu$ diameter has been used for 600 volts, with an aspect ratio of about 15 to 1.

In a preferred embodiment of the invention the various wells 22 to 30 are located in a square lattice with a spacing of 9 microns center-to-center along the sides of the squares. Other spacings and symmetries could be used.

Figure 4:
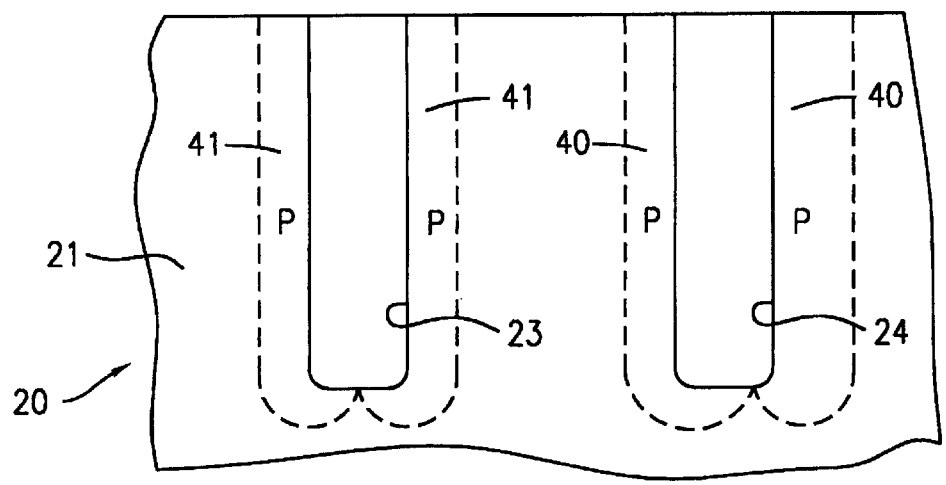
FIG. 4 shows the cross-section of FIG. 2 after the implantation of alternate axially elongated N and P stripes around the circumference of each of the cells.
Figure 4A:
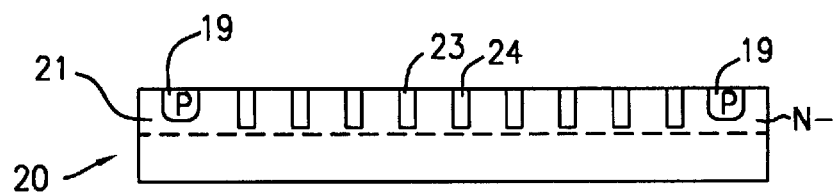
FIG. 4A shows the full chip of FIG. 4 with a P diffused guard ring surrounding its active area.
Figure 7:
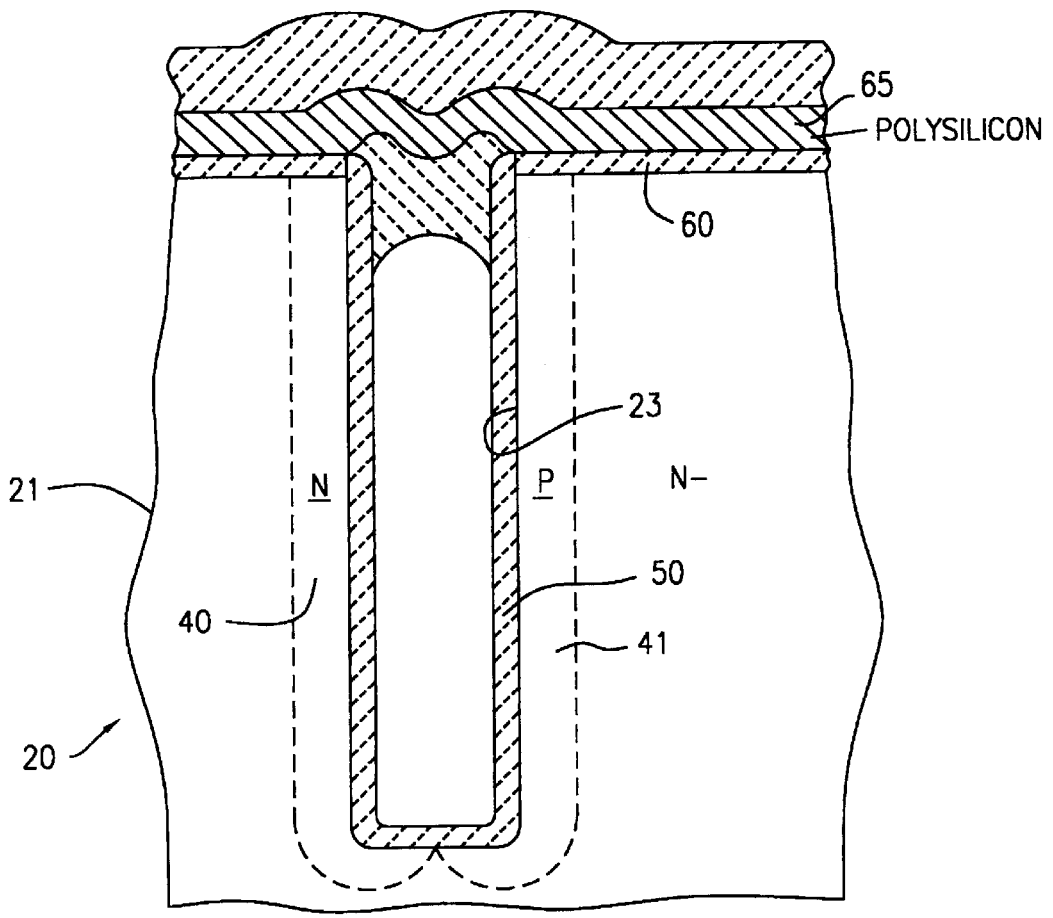
FIG. 7 is a cross-section of FIG. 6 taken across section line 7—7 in FIG. 6.
Figure 6:
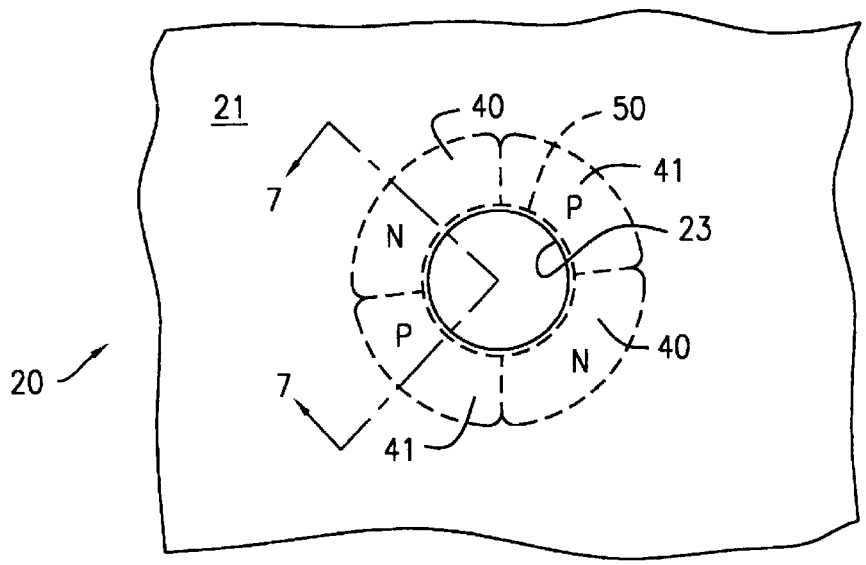
FIG. 6 is a top view of one of the cells of FIG. 5 after forming an oxide on the walls of the trench.
Figure 8:
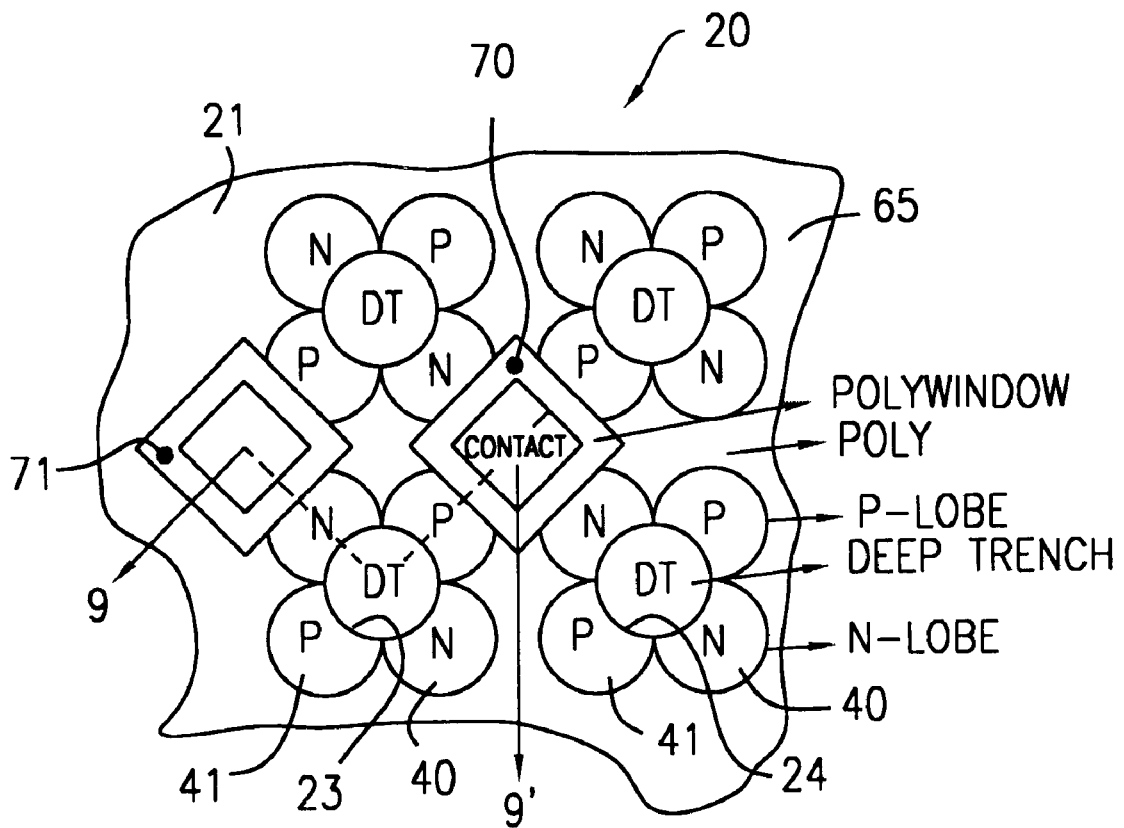
FIG. 8 is a schematic top view of the device of FIGS. 6 and 7 after the formation of a polysilicon gate layer.

The full chip is shown in cross-section in FIG. 4A after the formation of the various wells. In accordance with an important aspect of the invention, a simple P diffusion ring 19 in the low resistivity epi 21 surrounds the device active area to serve as a termination. Any other termination conventionally used with high resistivity epi (that is, epi having a concentration appropriate for a planar junction of the desired voltage) can also be used.

Alternate N and P lobe-shaped, vertical extending stripes are then formed along the full depth of wells 22 to 30. These are shown in FIGS. 4 to 9 for the case of cells 23 and 24 as alternate N stripes (or lobes) 40 and P stripes (or lobes) 41. N stripes 40 are formed by the controlled implant (at a slight angle, for example, 2° to 6° to the axis of the cell) of phosphorus ions having an energy of (100) Kev and a dose of about (1E13) atoms per cm$^2$. The P stripes are similarly formed but by a controlled boron implant at an energy of (30) Kev and dose of about (1E13) atoms per cm$^2$.

The N and P stripes 40 and 41 are arranged to face the same concentration lobe or stripes on all adjacent or facing cells. Their concentrations and depths are arranged such that the N and P stripes will all fully deplete under a blocking voltage condition.

Figure 9:
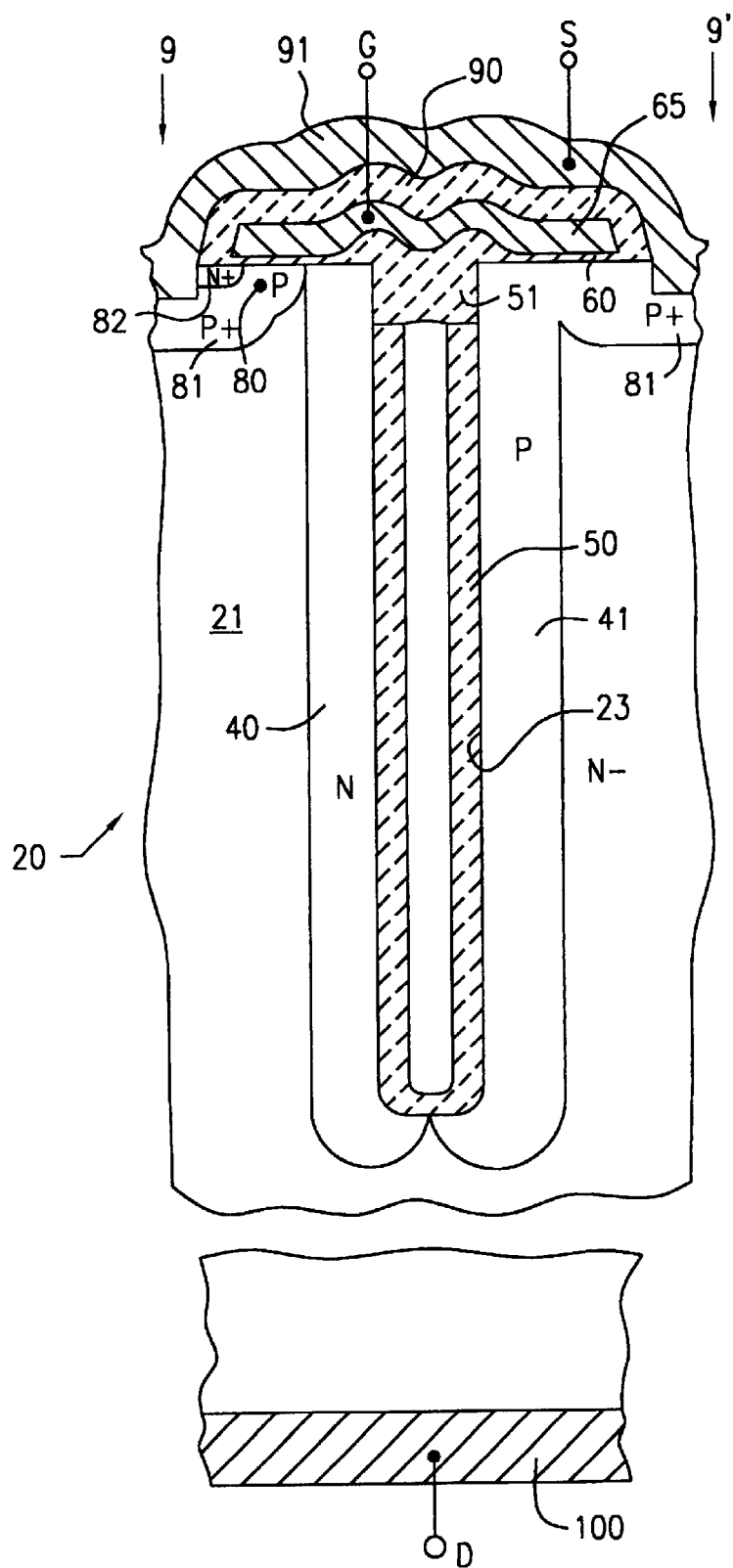
FIG. 9 is a cross-section of FIG. 8 taken across section line 9—9 in FIG. 8 and shows the DMOS control structure and the source and drain electrodes.
Figure 10:
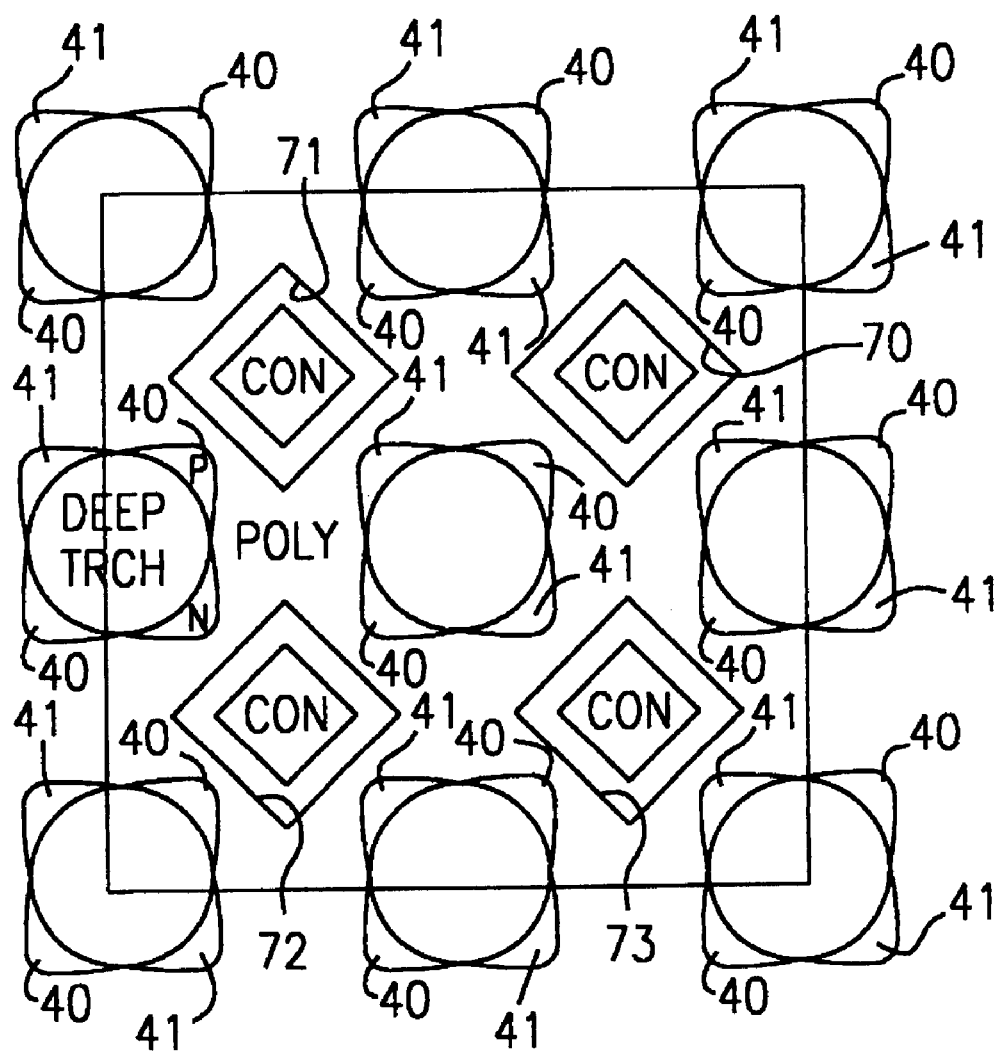
FIG. 10 shows the layout of cells similarly to that shown in FIG. 8 and demonstrates the alignment of the N and P stripes relative to one another.

After the formation of lobes 40 and 41, the sidewalls of each of the cells 22 to 30 are lined with an undoped TEOS layer 50 (FIGS. 6, 7 and 9) to a thickness of about 0.75 micron. A subsequent layer of LPCVD silicon nitride (about 1500 Å) is deposited. The tops of wells 22 to 30 are next plugged off and sealed by low temperature (LTO) oxide "plugs" 51 (FIG. 9). Plugs 51 are formed by depositing a doped LTO layer over the device surface, which may be 1 to 3 microns thick and is reflowed. The layer is then etched to the nitride surface and the nitride is etched to the underlying TEOS surface, leaving the plugs 51 in place on each of the wells.

A further layer 60 of TEOS (FIGS. 7 and 9) is then deposited atop the TEOS surface to make up a thickness of about 1 micron. The active area is then exposed by etching this 1 $\mu$ TEOS oxide which is masked as required. The deep trench plug is protected during this wet etch. A gate oxide is then grown, to about 1000 Å and a conductive polysilicon is deposited atop the gate oxide.

The process continues with a conventional DMOS process to fabricate the P channel, N$^+$ source and P base regions self aligned to openings formed in the polysilicon film.

A conventional planar DMOS process is used to form P$^-$ channel regions such as channel 80 (FIG. 9) and deep P$^+$ base regions 81. Thus, an N$^+$ source 82 is formed adjacent each N lobe 40 and the gate oxide 60 and polysilicon web 65 (FIG. 9) spans the invertible channel region 80. An interlayer oxide 90 is next formed and extends across the polysilicon layer 65. Layer 90 than suitably etched and a source contact 91 is applied, which overlies oxide 90 and contacts the P$^+$ base web 81 and source segments 82 through the windows 70 to 73 in the polysilicon 65. A drain contact 100 is also applied to the bottom of wafer 20. While the active area is shown with a cellular geometry, it should be noted that other contact geometries, for example, elongated stripes can also be used.

The device of FIG. 9 operates as follows:

During blocking (non-conduction in the presence of a biasing drain to source voltage between drain contact 100 and source contact 91) the lobes 40 and 41 around each well are designed to deplete each other out. The epitaxial layer 21, being a high resistivity layer does not affect this depletion significantly. Guard ring diffusions (not shown) can surround the active area of the device to terminate the chip or wafer in conventional fashion within the high resistivity epitaxial layer and will withstand the maximum blocking voltage.

During conduction, the polysilicon gate 65 is biased positively, and a channel is formed in the P$^-$ base regions 80 so that electrons flow from source 91 through the inverted channel and into and down the relatively high concentration N type lobes 40, vertically to drain 100. The P lobes 41 are not invertable and do not contribute to conduction. Since the conduction path is a relatively high N concentration (compared to the high resistivity epi layer 21) the device has a relatively low $R_{DSON}$ while having a high blocking voltage due to the mutual depletion of lobes 40 and 41 in a voltage blocking condition.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A superjunction device comprising a substrate of silicon having a given high resistivity; plurality of spaced wells formed vertically in said substrate; each of said wells having a plurality of N and P stripes formed into their interior surfaces and extending along the length of said wells, said N and P stripes being alternately arranged around the interior surface of each of said wells, said N and P stripes having a thickness and concentration whereby, when a blocking voltage is applied across the thickness of said substrate and along the length of said wells, said N and P regions fully deplete one another; the concentration of one of said pluralities of stripes being higher than that of said substrate.

2. The device of claim 1 wherein said wells are circular in cross-section.

3. The device of claim 2 wherein said wells are spaced symmetrically with respect to one another.

4. The device of claim 3 which further includes a drain contact coupled to the bottom surface of said substrate and a double diffusion metal oxide semiconductor (DMOS) contact structure formed on the top surface of said device and comprising a gate structure, a channel structure and a source structure coupled to the top of one of said sets of N or P stripes whereby the application of a gate voltage to said gate structure permits the flow of carriers between said source structure and said drain contact.

5. The device of claim 2 wherein said device further has a termination structure surrounding said wells and which is formed in said high resistivity region.

6. The device of claim 5 which further includes a drain contact coupled to the bottom surface of said substrate and a double diffusion metal oxide semicondutor (DMOS) contact structure formed on the top surface of said device and comprising a gate structure, a channel structure and a source structure coupled to the top of one of said sets of N or P stripes whereby the application of a gate voltage to said gate structure permits the flow of carriers between said source structure and said drain contact.

7. The device of claim 2 which further includes a drain contact coupled to the bottom surface of said substrate and a double diffusin metal oxide semiconductor (DMOS) contact structure formed on the top surface of said device and comprising a gate structure, a channel structure and a source structure coupled to said sets of N stripes whereby the application of a gate voltage to said gate structure permits the flow of carriers between said source structure and said drain contact and through said N stripes.

8. The device of claim 1 which further includes a drain contact coupled to the bottom surface of said substrate and a double diffusion metal oxide semiconductor (DMOS) contact structure formed on the top surface of said device and comprising a gate structure, a channel structure and a source structure coupled to one of said sets of N or P stripes, whereby the application of a gate voltage to said gate structure permits the flow of carriers between said source structure and said drain contact and through said one of said sets of N or P stripes.

9. The device of claim 1 wherein said wells are spaced symmetrically with respect to one another.

10. The device of claim 9 wherein said device further has a termination structure surrounding said wells and which is formed in said high resistivity region.

11. The device of claim 10 which further includes a drain contact coupled to the bottom surface of said substrate and a double diffusion metal oxide semiconductor (DMOS) contact structure formed on the top surface of said device and comprising a gate structure, a channel structure and a source structure coupled to the top of one of said sets of N or P stripes whereby the application of a gate voltage to said gate structure permits the flow of carriers between said source structure and said drain contact.

12. The device of claim 9 which further includes a drain contact coupled to the bottom surface of said substrate and a double diffusion metal oxide semiconductor (DMOS) contact structure formed on the top surface of said device and comprising a gate structure, a channel structure and a source structure coupled to said sets of N stripes whereby the application of a gate voltage to said gate structure permits the flow of carriers between said source structure and said drain contact and through said N stripes.

13. The device of claim 1 wherein said device further has a termination structure surrounding said wells and which is formed in said high resistivity region.

14. The device of claim 13 which further includes a drain contact coupled to the bottom surface of said substrate and a double diffusion metal oxide semiconductor (DMOS) contact structure formed on the top surface of said device and comprising a gate structure, a channel structure and a source structure coupled to said sets of N stripes whereby the application of a gate voltage to said gate structure permits the flow of carriers between said source structure and said drain contact and through said N stripes.

15. The device of claim 1 which further includes a drain contact coupled to the bottom surface of said substrate and a double diffusion metal oxide semiconductor (DMOS) contact structure formed on the top surface of said device and comprising a gate structure, a channel structure and a source structure coupled to one of said at least first or second N or P stripes, whereby the application of a gate voltage to said gate structure permits the flow of carriers between said source structure and said drain contact and through said one of said at least one of said first or second N or P stripes.

16. A superjunction device comprising a substrate of silicon having a given high resistivity and a given conductivity type; plurality of spaced wells formed vertically in said substrate; each of said wells having a plurality of N and P stripes formed into their interior surfaces and extending along the length of said wells, said N and P stripes being alternately arranged around the interior surface of each of said wells, said N and P stripes having a thickness and concentration whereby, when a blocking voltage is applied across the thickness of said substrate and along the length of said wells, said N and P regions fully deplete one another; the concentration of said stripes which have the same concentration type as said substrate being higher than that of said substrate.

17. The device of claim 16 wherein said wells are circular in cross-section.

18. The device of claim 16 wherein said wells are spaced symmetrically with respect to one another.

19. The device of claim 16 wherein said device further has a termination structure surrounding said wells and which is formed in said high resistivity region.

20. A superjunction device comprising a substrate of silicon having a given high resistivity and a given conductivity type; plurality of spaced wells formed vertically in said substrate; each of said wells having a first plurality of stripes of one conductivity type and a second plurality of stripes of the other conductivity type formed into their interior surfaces and extending along the length of said wells, said first and second plurality of stripes being alternately arranged around the interior surface of each of said wells, said first and second pluralities of stripes having a thickness and concentration whereby, when a blocking voltage is applied across the thickness of said substrate and along the length of said wells, said stripe fully deplete one another; the concentration of one of said pluralities of said first plurality of stripes being higher than that of said substrate.

21. The device of claim 20 wherein said wells are circular in cross-section.

22. The device of claim 20 wherein said wells are spaced symmetrically with respect to one another.

23. The device of claim 20 wherein said device further has a termination structure surrounding said wells and which is formed in said high resistivity region.

24. The device of claim 20 which further includes a drain contact coupled to the bottom surface of said substrate and a DMOS contact structure formed on the top surface of said device and comprising a gate structure, a channel structure and a source structure coupled to said first plurality of stripes, whereby the application of a gate voltage to said gate structure permits the flow of carriers between said source structure and said drain contact and through said first plurality of stripes.

25. A superiunction device comprising a substrate of silicon having a given high resistivity; a plurality of spaced wells formed vertically into said substrate; each of said wells having a plurality of N and P stripes formed into their interior surfaces and extending along the length of said wells, said N and P stripes being alternately arranged around the interior surface of each of said wells, said N and P stripes having a thickness and concentration whereby, when a blocking voltage is applied across the thickness of said substrate and along the length of said wells, said N and P regions fully deplete one another; the concentration of one of said pluralities of stripes of the same conductivity type as that of said substrate being higher than that of said substrate; a source contact atop said device; and a double diffusion metal oxide semiconductor (DMOS) contact structure formed on the top surface of said device; said DMOS contact structure including a gate oxide layer and an overlying conductive polysilicon gate layer; said gate oxide layer and polysilicon gate layer having an opening therein which exposes the underlying substrate for the diffusion of source and channel regions and to provide an opening for connection of said source contact to the source and channel diffusions which are exposed by said opening.

26. The device of claim 25, wherein a plurality of said wells are spaced from one another and are disposed at the corners of a polygonal pattern; said opening in said polysilicon layer having polygonal shape smaller than and similar in topology to that of said polygonal pattern and having a geometric center in alignment with the geometric center of said polygonal pattern; said polygonal opening in said polysilicon layer being rotated about said center with respect to said polygonal pattern, whereby the space between all of the sides of said polygonal opening in a direction perpendicular to said sides and the corners of said polygonal pattern are equal.

27. The device of claim 26, wherein said polygonal pattern and said polygonal opening are each squares.

28. The device of claim 27, wherein said device further has a termination structure surrounding said wells and which is formed in said high resistivity region.

29. The device of claim 26, wherein said device further has a termination structure surrounding said wells and which is formed in said high resistivity region.

30. The device of claim 25, wherein said device further has a termination structure surrounding said wells and which is formed in said high resistivity region.

* * * * *